US006625003B2

United States Patent
Loo et al.

(10) Patent No.: US 6,625,003 B2
(45) Date of Patent: Sep. 23, 2003

(54) METHOD AND APPARATUS FOR BALANCING AN ELECTROSTATIC FORCE PRODUCED BY AN ELECTROSTATIC CHUCK

(75) Inventors: David Loo, San Jose, CA (US); Jr-Jyan Chen, Santa Clara, CA (US); Kenny K. Ngan, Fremont, CA (US); Bradley O. Stimson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/286,688

(22) Filed: Nov. 1, 2002

(65) Prior Publication Data

US 2003/0053283 A1 Mar. 20, 2003

Related U.S. Application Data

(63) Continuation of application No. 09/593,848, filed on Jun. 14, 2000, now abandoned.
(60) Provisional application No. 60/139,710, filed on Jun. 17, 1999.

(51) Int. Cl.[7] ............................. H01G 3/00; H01H 3/00; H01T 23/00; H02B 23/00; H02H 23/00; H05F 23/00
(52) U.S. Cl. ....................................... 361/234; 361/233
(58) Field of Search .................................. 361/234, 115, 361/230, 233, 235

(56) References Cited

U.S. PATENT DOCUMENTS

| | | | |
|---|---|---|---|
| 5,103,367 A | 4/1992 | Horwitz et al. | 361/234 |
| 5,708,250 A | 1/1998 | Benjamin et al. | 219/121.58 |
| 5,737,175 A | 4/1998 | Grosshart et al. | 361/234 |
| 5,812,361 A | 9/1998 | Jones et al. | 361/234 |
| 5,835,333 A | 11/1998 | Castro et al. | 361/234 |
| 5,835,335 A | 11/1998 | Ross et al. | 361/234 |
| 5,894,400 A | 4/1999 | Graven et al. | 361/234 |
| 6,125,025 A | 9/2000 | Howald et al. | 361/234 |
| 6,273,023 B1 | 8/2001 | Tsuchihashi et al. | 118/723 E |
| 6,361,645 B1 * | 3/2002 | Schoepp et al. | 156/345 |

* cited by examiner

Primary Examiner—Brian Sircus
Assistant Examiner—Z Kitov
(74) Attorney, Agent, or Firm—Moser, Patterson & Sheridan, LLP

(57) ABSTRACT

A bipolar electrostatic chuck containing apparatus, and a concomitant method, for balancing an electrostatic force that the bipolar electrostatic chuck imparts upon a workpiece. More specifically, the bipolar electrostatic chuck contains a chuck body having a pair of electrodes embedded therein, a primary power supply and an offset power supply. Each electrode within the bipolar electrostatic chuck is respectively connected to a terminal on the primary power. Based upon a voltage produced by the primary power supply and a bias voltage of the workpiece, an offset voltage is applied by the offset power supply to one of the terminals, thus balancing the electrostatic force applied to the workpiece.

28 Claims, 2 Drawing Sheets

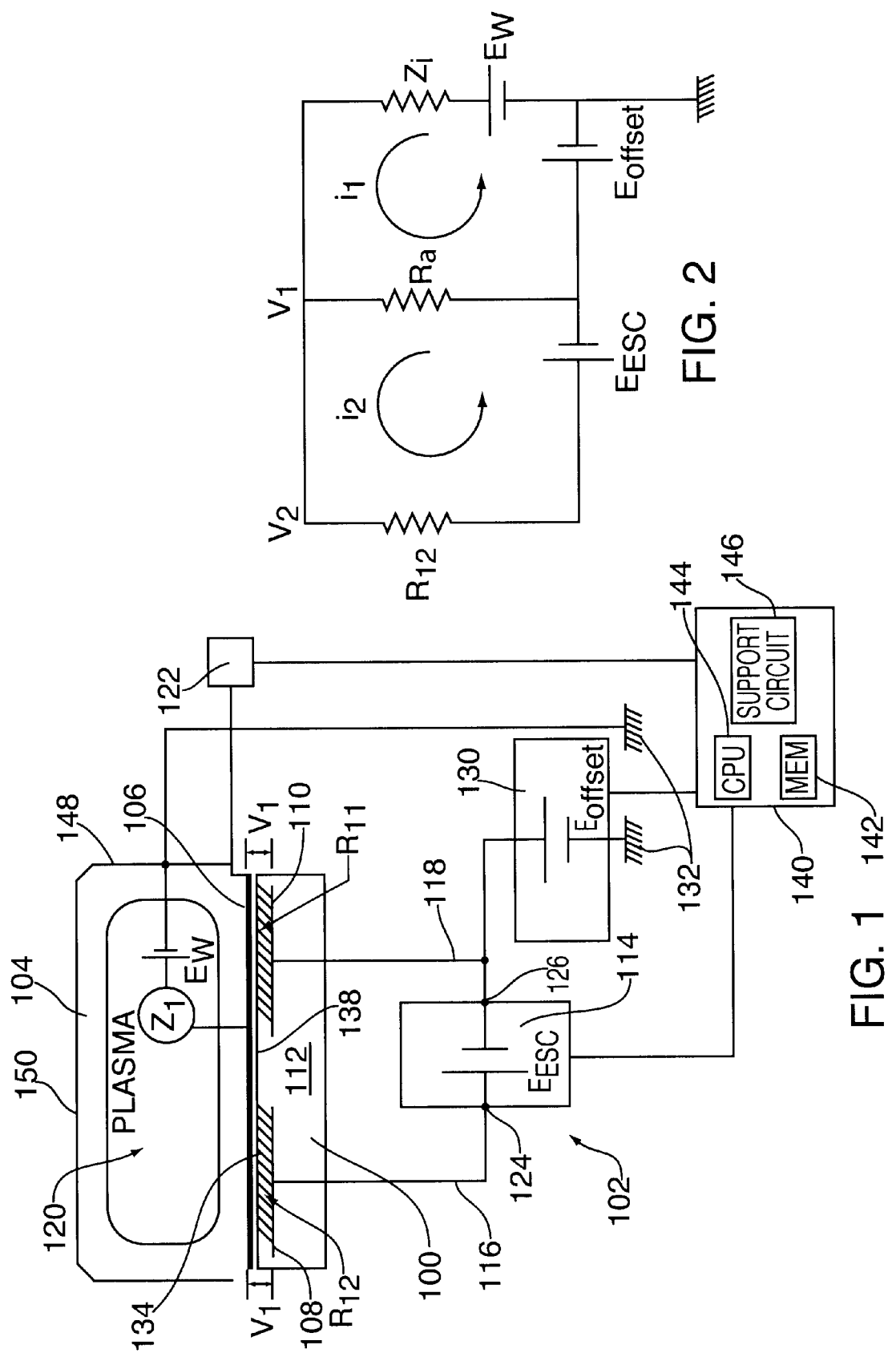

METHOD AND APPARATUS FOR BALANCING AN ELECTROSTATIC FORCE PRODUCED BY AN ELECTROSTATIC CHUCK

CROSS-REFERENCE TO RELATED APPLICATIONS

This application is a continuation of prior U.S. patent application Ser. No. 09/593,848, filed Jun. 14, 2000, now abandoned which claims benefit to U.S. Provisional Application No. 60/139,710 filed Jun. 17, 1999, which are herein incorporated by reference.

BACKGROUND OF THE DISCLOSURE

1. Field of the Invention

The invention relates to a substrate support chuck for electrostatically retaining a workpiece upon the support surface of the chuck. More particularly, the invention relates to a bipolar electrostatic chuck having apparatus for balancing the electrostatic force applied to a workpiece supported by the chuck.

2. Description of the Background Art

Substrate support chucks are widely used to support substrates within semiconductor processing systems. One example of an electrostatic chuck is described in commonly assigned European Patent Publication Number 0 439 000 B1, published Sep. 14, 1994. This electrostatic chuck has a conventional chuck body containing a dielectric material having a pair of coplanar electrodes embedded therein. The electrodes are half-moon or D-shaped such that each electrode provides clamping force to half the workpiece that is supported by a support surface of the chuck body.

In operation, a chucking voltage is applied to each electrode that causes an electric field to form between the electrodes. This electric field causes charge to distribute on the underside of the wafer that is oppositely polarized to charge located on the chuck surface. The Coulomb force between the charge on the wafer and the charge on the chuck surface attracts the wafer to the chuck. As such, the wafer is retained (clamped) upon the chuck surface.

Ideally, the electrostatic force that retains the wafer should be uniform across the entire underside of the wafer. However, in reality, this electrostatic force may vary substantially across the wafer during processing. The force primarily varies due to the reduction in voltage at one electrode and the increase in voltage at the other electrode caused by a bias voltage acquired by the wafer once the wafer is exposed to an RF-induced plasma. The bias voltage acquired by the wafer is the result of electrons, which are highly mobile as compared to ions also comprising the plasma, leaving the plasma and accumulating on the wafer surface, thus creating a negative charge. As the local electrostatic force is proportional to the voltage drop across each electrode and the wafer, a disparity in electrostatic force laterally across the wafer results.

For example, in a bipolar, dielectric electrostatic chuck such as that described in European Patent discussed above, the combination of the two electrodes and the wafer form, in effect, a pair of series connected capacitors. If, for example, a power source applies ±400 Volts to the electrodes of a bipolar electrostatic chuck, and a plasma imparts a wafer bias of −100 Volts (as most electrostatic chucks are configured to be cathodes), the voltage drop between one electrode and the wafer will decrease by 100 Volts while at the electrode of opposite polarity, the voltage drop will increase by 100 Volts. This change in the voltage drop between the electrodes and the wafer due to the wafer bias results in an unequal clamping forces to be applied to each half of the wafer.

One example of apparatus used to balance these electrostatic forces is a bipolar electrostatic chuck driven by a dual power supply having a center tap. The center tap is coupled directly to a wafer residing atop the bipolar electrostatic chuck. The center tap effectively creates a feedback loop such that a change in the bias voltage on the wafer is referenced back to the power supply. As such, the voltage differential that generates the electrostatic force is maintained at both electrodes. Such an apparatus is disclosed in U.S. Pat. No. 5,764,471, issued Jun. 9, 1998, by Burkhart.

Although using the center tap coupled to the wafer provides an improvement in electrostatic force balancing in a bipolar electrostatic chuck, the connection between the center voltage tap and the wafer creates current leakage paths through the wafer. This current flow through the wafer often damages devices fabricated into the workpiece.

Another apparatus for balancing these electrostatic forces uses a third power supply at the center tap. The third power supply provides a voltage that approximately matches the wafer potential. As such, the imbalance in power supply voltages that are applied to the electrodes are compensated for. That is, an unequal voltage drop from the wafer to each of the electrodes would be adjusted by supplying a matched voltage from the third power supply. However, this type of configuration requires additional hardware (i.e., the third power supply, matching networks, and computer software/hardware I/O and the like) that are both costly and undesirable.

Therefore, a need exists in the art for apparatus and a concomitant method of automatically balancing the electrostatic force between an electrostatic chuck and a workpiece without relying on the presence of a plasma proximate the workpiece, coupling the wafer with the chucking circuit, or adding power supplies.

SUMMARY OF THE INVENTION

The disadvantages of the prior art are overcome by the present invention of a bipolar electrostatic chuck containing apparatus for balancing the electrostatic force that the bipolar electrostatic chuck imparts to a workpiece positioned upon the bipolar electrostatic chuck. More specifically, the invention is a bipolar electrostatic chuck coupled to a first and a second power supply. The electrostatic chuck contains a chuck body that is adapted to support a wafer during processing. A first electrode coupled to a first terminal of the first power supply is embedded in the chuck body. A second electrode is embedded in the chuck body. The second electrode is coupled to a second terminal of the second power supply and a first terminal of the second power supply. A second terminal of the second power supply is also coupled to ground.

In another embodiment, a method for balancing the electrostatic force that the bipolar electrostatic chuck imparts to a workpiece positioned upon the bipolar electrostatic chuck is provided. The method comprises measuring a bias voltage between a substrate and an electrostatic chuck having two electrodes, calculating an ouput voltage, and applying the output voltage to only one electrode of the electrostatic chuck.

BRIEF DESCRIPTION OF THE DRAWINGS

The teachings of the present invention can be readily understood by considering the following detailed description in conjunction with the accompanying drawings, in which:

FIG. 1 depicts a schematic cross-sectional view of a bipolar electrostatic chuck in accordance with the subject invention;

FIG. 2 depicts a simplified circuit schematic for the bipolar electrostatic chuck of FIG. 1.

To facilitate understanding, identical reference numerals have been used, where possible, to designate identical elements that are common to the figures.

DETAILED DESCRIPTION

Figure 3:
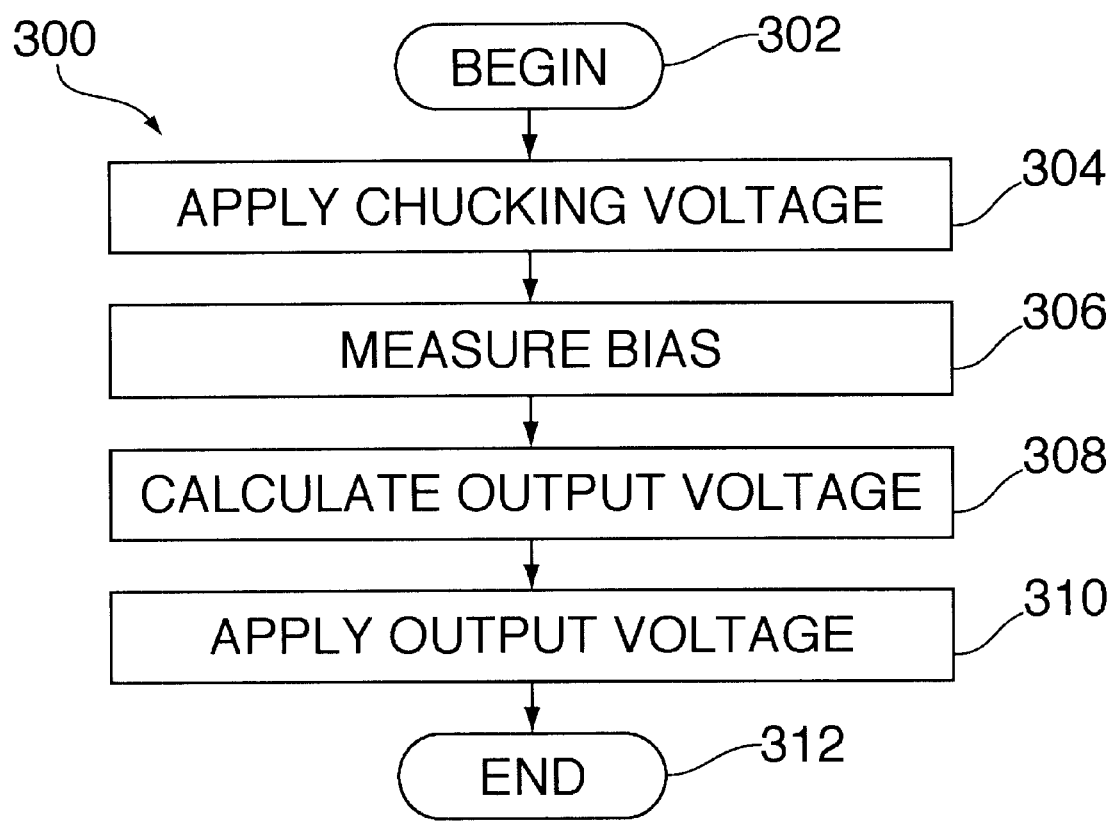
FIG. 3 depicts a block diagram of a method for balancing voltages within a bipolar electrostatic chuck in accordance with the subject invention.

FIG. 1 depicts a schematic cross-sectional view a bipolar electrostatic chuck 100 coupled to a power circuit 102. To illustrate the use of the invention, FIG. 1 depicts the bipolar electrostatic chuck 100 disposed within a semiconductor processing chamber 104. The semiconductor processing chamber 104 has walls 148 and a lid 150 that confine a plasma 120. The walls 148 of the semiconductor processing chamber 104 are coupled to ground 132. The semiconductor processing chamber 104 is coupled to a controller 140. The bipolar electrostatic chuck 100 has a surface 138 that supports a semiconductor wafer 106. FIG. 2 depicts a simplified circuit schematic for the electrostatic chuck of FIG. 1. For best understanding of the invention, the reader is encouraged to refer to both FIG. 1 and FIG. 2 while reading the following disclosure.

The bipolar electrostatic chuck 100 contains a first electrode 108 and a second electrode 110 embedded within a dielectric chuck body 112, preferably fabricated from a ceramic such as aluminum nitride, boron nitride, or alumina. The first electrode 108 and the second electrode 110 are separated from the surface 138 of the bipolar electrostatic chuck 100 by a thin dielectric layer 134 of the chuck body 112. The dielectric layer 134 may be a separate layer of material or a portion of the chuck body 112 defined between the respective electrode 108, 110 and the surface 138 of the electrostatic chuck 100. Preferably, the dielectric layer 134 has a uniform thickness between each electrode 108, 110 and the surface 138. An illustrative ceramic electrostatic chuck is disclosed in U.S. Pat. No. 4,117,121, issued May 26, 1992 herein incorporated by reference. Examples of dielectric electrostatic chucks are disclosed in U.S. Pat. No. 4,184,188 issued Jan. 15, 1980 and U.S. Pat. No. 4,384,918 issued May 24, 1983, both of which are incorporated herein by reference.

During wafer 106 processing, the plasma 120 characterized by an impedance $Z_i$, is generated within the semiconductor processing chamber 104. The plasma 120 conductively couples the wafer 106 to the semiconductor processing chamber 104 and ground 132. Due to the charge distribution within the plasma 120, a wafer bias $E_w$ is imparted upon the wafer 106. The magnitude of the wafer bias $E_w$ is determined using a measuring means 122. The measuring means 122 provides a signal indicative of the wafer bias $E_w$ to the controller 140. The measuring means 122 determines the wafer bias $E_w$ from an exposed electrode, RF peak to peak measurement, selected (manually or via software and/or hardware) from a pre-defined table, or the like.

To facilitate application of an electrostatic force between the wafer 106 and bipolar electrostatic chuck 100, the first electrode 108 and the second electrode 110 are coupled to the power circuit 102. The power circuit 102 is coupled to the controller 140. Central to the power circuit 102 is a primary power supply 114. The primary power supply 114 has a positive terminal 124 coupled to the first electrode 108 by a first circuit leg 116 and a negative terminal 126 coupled, to the second electrode 110 by a second circuit leg 118. The power circuit 130 also comprises an offset power supply 130. The offset power supply 130 is coupled between the second electrode 110 and the ground 132. The offset power supply 130 provides a voltage output $E_{OFFSET}$ that is further discussed below. The offset power supply is coupled to, and controlled by the controller 140.

The equivalent circuit of FIG. 1 is depicted in FIG. 2 when considering only the DC components of the process chamber 104. Using conventional circuit analysis techniques, currents $i_1$ and $i_2$ can be expressed as follows:

$$i_1 = \frac{(E_W - E_{OFFSET})(R_{l1} - R_{l2}) - E_{ESC}R_{l1}}{(Z_i + R_{l1})(R_{l1} - R_{l2}) - R_{l1}^2} \quad (1)$$

$$i_2 = \frac{-(Z_i + R_{l1})E_{ESC} + (E_W - E_{OFFSET})R_{l1}}{(Z_i + R_{l1})(R_{l1} - R_{l2}) - R_{l1}^2} \quad (2)$$

and $$V_1 = (i_1 - i_2)R_{l1} \quad (3)$$

$$V_2 = i_2 R_{l2} \quad (4)$$

where,
$E_{OFFSET}$: offset voltage output
$E_{ESC}$: primary power supply output
$E_w$: wafer potential
$Z_i$: plasma impedance
$R_{l1}$ leakage resistance between wafer and first electrode 108
$R_{l2}$ leakage resistance between wafer and second electrode 110

To balance the chucking forces applied by the first electrode 108 and the second electrode 110 to the wafer 106, the voltage drop $V_1$ must equal $-V_2$. Thus, setting equation 3 equal to equation 4 and substituting equation 1 for $i_1$ and equation 2 for $i_2$, the offset voltage $E_{OFFSET}$ can be resolved as:

$$E_{OFFSET} = E_W + \frac{Z_i(R_{l1} - R_{l2}) - R_{l1}R_{l2}}{2R_{l1}R_{l2}} E_{ESC} \quad (5)$$

Assuming uniform resistance across the dielectric layer 134, i.e., $R_{l1} = R_{l2}$, equation (5) simplifies to:

$$E_{OFFSET} = E_w - \frac{1}{2}E_{ESC} \quad (6)$$

Thus the chucking forces are balanced in the bipolar electrostatic chuck 100 by applying the voltage output $E_{OFFSET}$ from the offset power supply 130 based upon wafer bias voltage $E_w$ obtained from the measuring means 122 and the known chucking voltage $E_{ESC}$. As such, variations in the electrostatic bipolar chuck construction or wafer bias imparted by a plasma proximate the wafer that may cause changes in the electrostatic force exerted upon the wafer by the electrodes are balanced by the voltage applied to one electrode by the offset power supply. As such, the voltage differential that generates the electrostatic force is maintained constant on both sides of the wafer.

The electrostatic forces between a bipolar electrostatic chuck and a wafer are balanced by executing the balancing method 300 illustrated in FIG. 3. The balancing method 300 begins at step 302, followed by applying chucking voltage $E_{ESC}$ to the pedestal (step 304), measuring the wafer bias voltage $E_W$ (step 306), calculating the voltage output $E_{OFFSET}$ using equation (6)(step 308), applying the voltage output $E_{OFFSET}$ to the second electrode 110 (step 310) and ending at step 312.

The controller 140 comprises a central processing unit (CPU) 144, a memory 142, and support circuits 146 for the CPU 144 is used to facilitate the application of the voltage output $E_{OFFSET}$ to the second electrode 110. The CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The control software that is used for implementing the etching process of the present invention is generally stored in memory 142 as a software routine. The software routine may also be stored and/or executed by a second CPU (not shown) that is remotely located from the hardware being controlled by the CPU 144. The software routine contains the method 300 depicted in FIG. 3 and is discussed below with respect to FIG. 1 and FIG. 2.

Referring simultaneously to FIG. 1 and FIG. 2, the software routine when executed by the CPU 144, transforms the general purpose computer into a specific purpose computer (controller) 140 that controls the chamber operation such that a fabrication process (i.e., etching) is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

The software routine controls the voltage output $E_{OFFSET}$. The software routine is executed as soon as the chucking voltage $E_{ESC}$ if applied to the wafer 106. The software routine comprises the steps of applying chucking voltage $E_{ESC}$ to the pedestal (step 304), measuring the wafer bias voltage $E_W$ (step 306), calculating the voltage output $E_{OFFSET}$ using equation (6) (step 308), and applying the voltage output $E_{OFFSET}$ to the second electrode 110 (step 310).

In operation, as the wafer 106 is chucked in absence of the plasma 120 over the wafer 106, the chucking voltage $E_{ESC}$ applied between the wafer 106 and each of the electrodes (108 and 110) is relatively equal such that the electrostatic force retaining the wafer 106 will be balanced. Once the plasma 120 is present above the wafer 106, the wafer 106 will obtain the wafer bias $E_w$. The wafer bias $E_W$ is measured by the measuring means 122 that supplies a signal to the controller 140. The controller 140 executes the software routine 300, and resolves equation (6). The controller 140 then provides a signal to the offset power supply 130 that applies the output voltage $E_{OFFSET}$ to the second electrode 110 in response to the signal. The output voltage $E_{OFFSET}$ thus balances $V_1$ and $V_2$, thus equalizing the chucking force across the wafer 106.

One skilled in the art will readily recognize that bipolar electrostatic chucks may often comprise more than two electrodes. However, the novel aspects of invention are easily adaptable to electrostatic chucks having a first circuit connecting a plurality of electrodes to one pole of a primary power supply and having a second circuit coupled to an offset power supply connecting a second plurality of electrodes to the second pole of the primary power supply. In either power circuit configuration, the use of neither extra (i.e., a third) power supply nor a resistor (or similar) bridge network is required to achieve the desired offset voltage to balance the chucking forces on the wafer.

Although various embodiments which incorporate the teachings of the present invention have been shown and described in detail, those skilled in the art can readily devise many other varied embodiments that still incorporate these teachings.

What is claimed is:

1. An electrostatic chucking system comprising:
   a chuck body adapted to support a wafer during processing;
   a first power supply having a first terminal and a second terminal;
   a second power supply having a first terminal and a second terminal, said second terminal coupled to ground;
   a first electrode embedded in said chuck body, said first electrode coupled to said first terminal of said first power supply; and
   a second electrode embedded in said chuck body, said second electrode coupled to said second terminal of said first power supply and coupled to said first terminal of said second power supply.

2. The electrostatic chucking system of claim 1, wherein the second electrode is coplanar with said first electrode.

3. The electrostatic chucking system of claim 1 further comprising:
   a means for measuring a bias of the wafer disposed on said chuck body.

4. The electrostatic chucking system of claim 2, wherein the means for measuring is selected from the group comprising an exposed electrode, RF peak to peak measurement, or a predefined table.

5. The electrostatic chucking system of claim 1, wherein the second power supply has an output expressed as:

$$E_{OFFSET} = E_w + \frac{Z_i(R_{l1} - R_{l2}) - R_{l1}R_{l2}}{2R_{l1}R_{l2}} E_{ESC}$$

where:
   $E_{OFFSET}$ is the output voltage of the second power supply;
   $E_{ESC}$ is an output voltage of the first power supply;
   $E_W$ is a potential of a wafer disposed on said chuck body;
   $Z_i$ is an impedance of a plasma disposed adjacent said chuck body;
   $R_{l1}$ is a leakage resistance between the wafer and said first electrode, and
   $R_{l2}$ is a leakage resistance between the wafer and said second electrode.

6. The electrostatic chucking system of claim 1, wherein the second power supply has an output equal to a wafer bias potential minus one half an output of said first power supply.

7. A semiconductor substrate processing chamber comprising:
   a process chamber;
   a first power supply having a first terminal and a second terminal;

a chuck body disposed in said process chamber, said chuck body adapted to support a wafer during processing;

a first electrode embedded in said chuck body, said first electrode coupled to said first terminal of said first power supply;

a second electrode embedded in said chuck body, said second electrode coupled with said second terminal of said first power supply; and a second power supply having a first terminal and a second terminal, said first terminal coupled to said second electrode and said second terminal coupled to ground.

8. The processing system of claim 7, wherein the second electrode is coplanar with said first electrode.

9. The processing system of claim 7 further comprising:

a means for measuring a bias of the wafer disposed on said chuck body.

10. The processing system of claim 9, wherein the means for measuring is selected from the group comprising an exposed electrode, RF peak to peak measurement, or a predefined table.

11. The processing system of claim 7, wherein the second power supply has an output expressed as:

$$E_{OFFSET} = E_w + \frac{Z_i(R_{l1} - R_{l2}) - R_{l1}R_{l2}}{2R_{l1}R_{l2}} E_{ESC}$$

where:

$E_{OFFSET}$ is the output voltage of the second power supply;

$E_{ESC}$ is an output voltage of the first power supply;

$E_W$ is a potential of a wafer disposed on said chuck body;

$Z_i$: is an impedance of a plasma disposed adjacent said chuck body;

$R_{l1}$ is a leakage resistance between the wafer and said first electrode, and $R_{l2}$ is a leakage resistance between the wafer and said second electrode.

12. The processing system of claim 7, wherein the second power supply has an output equal to a wafer bias potential minus one half an output of said first power supply.

13. A method for dechucking a substrate from an electrostatic chuck comprising the steps of:

measuring a bias voltage between a substrate and an electrostatic chuck having two electrodes;

calculating an ouput voltage; and applying said output voltage to only one electrode of said electrostatic chuck.

14. The method of claim 13 further comprising the step of applying a chucking voltage between the electrodes of said electrostatic chuck.

15. The method of claim 14, wherein the applied chucking voltage is provided by a power source other than a power source that provides said output voltage.

16. The method of claim 13, wherein the output voltage is expressed as:

$$E_{OFFSET} = E_w + \frac{Z_i(R_{l1} - R_{l2}) - R_{l1}R_{l2}}{2R_{l1}R_{l2}} E_{ESC}$$

where:

$E_{OFFSET}$ is the output voltage of the second power supply;

$E_{ESC}$ is an output voltage of the first power supply;

$E_W$: is a potential of a wafer disposed on said chuck body;

$Z_i$: is an impedance of a plasma disposed adjacent said chuck body;

$R_{l1}$ is a leakage resistance between the wafer and said first electrode, and $R_{l2}$ is a leakage resistance between the wafer and said second electrode.

17. The method of claim 13, wherein the output voltage is equal to the measured bias voltage minus one half the chucking voltage.

18. The method of claim 13, wherein the step of measuring the bias voltage further comprises the step of:

providing a controller with a signal indicative of the bias voltage, said signal provided by an exposed electrode, RF peak to peak measurement, or a predefined table.

19. A computer-readable medium having stored thereon a plurality of instructions, the plurality of instructions including instructions which, when executed by a processor, cause a semiconductor processing system to perform the steps of:

measuring a bias voltage between a substrate and an electrostatic chuck having two electrodes;

calculating an ouput voltage; and applying said output voltage to only one electrode of said electrostatic chuck.

20. The computer-readable medium of claim 19 further comprising the step of applying a chucking voltage between the electrodes of said electrostatic chuck.

21. The computer-readable medium of claim 19, wherein the applied chucking voltage is provided by a power source other than a power source that provides said output voltage.

22. The computer-readable medium of claim 19, wherein the output voltage is expressed as:

$$E_{OFFSET} = E_w + \frac{Z_i(R_{l1} - R_{l2}) - R_{l1}R_{l2}}{2R_{l1}R_{l2}} E_{ESC}$$

where:

$E_{OFFSET}$ is the output voltage of the second power supply;

$E_{ESC}$ is an output voltage of the first power supply;

$E_W$: is a potential of a wafer disposed on said chuck body;

$Z_i$: is an impedance of a plasma disposed adjacent said chuck body;

$R_{l1}$ is a leakage resistance between the wafer and said first electrode, and $R_{l2}$ is a leakage resistance between the wafer and said second electrode.

23. The computer-readable medium of claim 19, wherein the output voltage is equal to the measured bias voltage minus one half the chucking voltage.

24. The computer-readable medium of claim 19, wherein the step of measuring the bias voltage further comprises the step of:

providing a controller with a signal indicative of the bias voltage, said signal provided by an exposed electrode, RF peak to peak measurement, or a predefined table.

25. A method of balancing electrostatic force produced by an electrostatic chuck comprising:

applying a chucking voltage to a first electrode and a second electrode of the electrostatic chuck; and applying a variable offset voltage to the first electrode to control an electrostatic force produced by a relative voltage applied to the first and second electrodes.

26. The method of claim 25, wherein the voltage is expressed as $$E_w + \frac{Z_i(R_{l1} - R_{l2}) - R_{l1}R_{l2}}{2R_{l1}R_{l2}} E_{ESC}$$

where:

$E_{ESC}$ is the chucking voltage;

$E_W$: is a potential of a wafer disposed on the electrostatic chuck;

$Z_i$: is an impedance of a plasma disposed adjacent to the electrostatic chuck, $R_{l1}$ is a leakage resistance between the wafer and said first electrode; and $R_{l2}$ is a leakage resistance between the wafer and said second electrode.

27. The method of claim 25, wherein the valuable offset is equal to a wafer bias potential minus one half the chucking voltage.

28. The method of claim 25 further comprising:

measuring a bias voltage of a wafer disposed on the electrostatic chuck and establishing a value for the variable offset voltage in response to the bias voltage.

* * * * *